(12) United States Patent
Okumura

(10) Patent No.: US 11,114,560 B2
(45) Date of Patent: Sep. 7, 2021

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Keiji Okumura, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 47 days.

(21) Appl. No.: 16/806,669

(22) Filed: Mar. 2, 2020

(65) Prior Publication Data

US 2020/0303541 A1    Sep. 24, 2020

(30) Foreign Application Priority Data

Mar. 18, 2019   (JP) .............................. JP2019-049467

(51) Int. Cl.

| H01L 29/78 | (2006.01) |
|---|---|
| H01L 29/16 | (2006.01) |
| H01L 29/06 | (2006.01) |
| H01L 29/66 | (2006.01) |
| H01L 29/10 | (2006.01) |
| H01L 29/167 | (2006.01) |
| H01L 21/04 | (2006.01) |

(52) U.S. Cl.
CPC ...... *H01L 29/7813* (2013.01); *H01L 29/0684* (2013.01); *H01L 29/1095* (2013.01); *H01L 29/167* (2013.01); *H01L 29/1608* (2013.01); *H01L 29/66068* (2013.01); *H01L 21/046* (2013.01)

(58) Field of Classification Search
CPC ............... H01L 21/046; H01L 29/7813; H01L 29/0684; H01L 29/1095; H01L 29/1608; H01L 29/167; H01L 29/66068
USPC .......................................................... 257/77
See application file for complete search history.

(56) References Cited

U.S. PATENT DOCUMENTS

2018/0138273 A1* 5/2018 Tsuji .................... H01L 29/1608
2019/0067462 A1* 2/2019 Tamura ............... H01L 29/0804

FOREIGN PATENT DOCUMENTS

JP          6284292 B2    2/2018

* cited by examiner

*Primary Examiner* — Igwe U Anya
(74) *Attorney, Agent, or Firm* — Rabin & Berdo, P.C.

(57) ABSTRACT

A silicon carbide semiconductor device includes a silicon carbide semiconductor substrate, a first semiconductor layer and a first semiconductor region each of a first conductivity type, and a first base region, a second semiconductor layer and a second semiconductor region each of a second conductivity type. The first base region opposes the second semiconductor region in a depth direction. A distribution of point defects in a depth direction from a first surface of the second semiconductor region, opposite a second surface of the second semiconductor region facing toward a front surface of the silicon carbide semiconductor substrate has two peaks at positions deeper than an interface between the first semiconductor layer and the first base region, where a first peak at a deeper position of the two peaks has a greater quantity of the point defects than does a second peak at a shallower position of the two peaks.

17 Claims, 6 Drawing Sheets

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2019-049467, filed on Mar. 18, 2019, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is ten times that of silicon or greater, and has a high possibility of exceeding the material limit of silicon. Therefore, future growth is strongly expected for power semiconductor applications, particularly MOSFETs. In particular, ON resistance thereof is expected to be small. Vertical SiC-MOSFETs having even lower ON resistance while maintaining high voltage characteristics can be expected.

A structure of a conventional silicon carbide semiconductor device will be described taking a vertical MOSFET as an example. FIG. 10 is a cross-sectional view schematically depicting a structure of the conventional silicon carbide semiconductor device. FIG. 10 is an example of a trench-type MOSFET 150. As depicted in FIG. 10, on a front surface of an $n^+$-type silicon carbide substrate 101, an $n^-$-type silicon carbide epitaxial layer 102 is deposited and on a surface of the $n^-$-type silicon carbide epitaxial layer 102, a p-type base layer 106 is deposited.

In an upper layer portion of the p-type base layer 106, an $n^+$-type source region 107, a $p^+$-type contact region 108, and a p-type body layer 118 are provided. The $n^+$-type source region 107 is disposed on both sides of a trench gate structure described hereinafter. The $p^+$-type contact region 108 is provided opposing trench gate structure, across the $n^+$-type source region 107. The p-type body layer 118 is disposed so as to surround a periphery of the $p^+$-type contact region 108 and is disposed to extend beneath the $n^+$-type source region 107.

Further, a trench 116 is provided penetrating through the p-type base layer 106 and the $n^+$-type source region 107, and reaching the $n^-$-type silicon carbide epitaxial layer 102. The $n^+$-type source region 107 is disposed so as to be in contact with a side surface of the trench 116.

An inner wall surface of the trench 116 is covered by a gate insulating film 109 configured by an oxide film, etc. and the trench 116 is embedded with a gate electrode 110 formed on a surface of the gate insulating film 109. Thus, the trench gate structure is configured.

Further, a source electrode 112 and gate wiring (not depicted) are provided on surfaces of the p-type base layer 106 and the $n^+$-type source region 107 and a surface of the gate electrode 110, via an interlayer insulating film 111. The source electrode 112 and the gate wiring are electrically insulated from each other on the interlayer insulating film 111. Through a contact hole formed in the interlayer insulating film 111, the source electrode 112 is in contact with the $p^+$-type contact region 108 and the $n^+$-type source region 107 electrically; and the gate wiring is in contact with the gate electrode 110 electrically.

Further, at a back surface side of the $n^+$-type silicon carbide substrate 101, a back electrode 113 (drain electrode) in contact with the $n^+$-type silicon carbide substrate 101 electrically is formed. By this structure, a MOSFET having an inversion-type trench gate structure of an n-channel type is configured.

In the trench-type MOSFET 150 configured as such, electric field is strongest at a PN junction interface formed by the p-type base layer 106 and the $n^-$-type silicon carbide epitaxial layer 102. Further, when point defects generated during ion implantation are present at the PN junction interface, drain leak paths are formed. Therefore, by making positions of the point defects shallower than the PN junction interface, drain leak current may be reduced. For example, the drain leak current may be reduced by setting X<Y, where X is a depth of peak positions of a quantity of point defects from the surface of the $n^+$-type source region 107 and Y is a depth from the surface of the $n^+$-type source region 107 to the PN junction interface formed by the p-type base layer 106 and the $n^-$-type silicon carbide epitaxial layer 102 (for example, refer to Japanese Patent No. 6284292).

SUMMARY OF THE INVENTION

According to an embodiment of the invention, a silicon carbide semiconductor device includes a silicon carbide semiconductor substrate of a first conductivity type, having a front surface and a back surface opposite to the front surface; a first semiconductor layer of the first conductivity type, provided on the front surface of the silicon carbide semiconductor substrate, and containing silicon carbide, the first semiconductor layer having an impurity concentration lower than an impurity concentration of the silicon carbide semiconductor substrate, and further having a first side, and a second side opposite to the first side and facing the front surface of the silicon carbide semiconductor substrate; a first base region of a second conductivity type, selectively provided in the first semiconductor layer, the first base having a first surface, and a second surface opposite to the first surface and facing the front surface of the silicon carbide semiconductor substrate; a second semiconductor layer of the second conductivity type, provided on the first side of the first semiconductor layer, and containing silicon carbide; a first semiconductor region of the first conductivity type, selectively provided in a surface layer of the second semiconductor layer; a second semiconductor region of the second conductivity type, selectively provided in the surface layer of the second semiconductor layer, and being in contact with the first semiconductor region, the second semiconductor region having a first surface, and a second surface opposite to the first surface and facing the front surface of the silicon carbide semiconductor substrate; a first electrode in contact with the first semiconductor region and the second semiconductor region; and a second electrode provided on the back surface of the silicon carbide semiconductor substrate. The first base region is provided so as to overlap the second semiconductor region in a depth direction. In the second semiconductor region, a distribution of point defects in the depth direction from the first surface of the second semiconductor region has first and second peaks at positions deeper than a position of an interface between the first semiconductor layer and the second surface of the first base region. The first peak has a deeper position than does the first peak and has a greater quantity of the point defects than does the second peak.

In the embodiment, the surface layer of the second semiconductor layer has a region that is free of the second semiconductor region. In the region free of the second semiconductor region, a distribution of point defects in the depth direction from a first surface of the region of the surface layer of the second semiconductor layer has one third peak at a position deeper than a position of an interface between the first semiconductor layer and the second semiconductor layer, the first surface of the region being opposite to a second surface of the region of the surface layer of the second semiconductor layer facing the front surface of the silicon carbide semiconductor substrate. The third peak has a smaller quantity of the point defects than does the first peak.

In the embodiment, the region that is free of the second semiconductor region is of the first conductivity type.

In the embodiment, the region that is free of the second semiconductor region has a SBD structure, a JBS structure, a PiN structure, or a MPS structure.

In the embodiment, the region that is free of the second semiconductor region is a JFET region.

In the embodiment, the region that is free of the second semiconductor region is a part of the first semiconductor region.

In the embodiment, the silicon carbide semiconductor device further includes a trench that penetrates the second semiconductor layer and the first semiconductor region, and reaches the first semiconductor layer; a second base region of the second conductivity type, selectively provided in the first semiconductor layer so as to contact a bottom of the trench; a gate electrode provided in the trench via a gate insulating film; and an interlayer insulating film provided on the gate electrode. The region that is free of the second semiconductor region is located between the bottom of the trench and the silicon carbide semiconductor substrate.

In the embodiment, the first base region contains aluminum as an impurity.

In the embodiment, the first semiconductor layer and the first semiconductor region contain nitrogen or phosphorus as an impurity.

In the embodiment, an impurity contained in the first base region has an atomic number larger than an atomic number of an impurity contained in the first semiconductor layer and the first semiconductor region.

In the embodiment, an impurity concentration of the first base region is higher than an impurity concentration of the second semiconductor region.

In the embodiment, a depth of the second peak from the interface between the first semiconductor layer and the second surface of the first base region is at least a thickness of the second semiconductor layer and at most a distance from a first surface of the second semiconductor layer to the second surface of the second base region facing toward the front surface of the silicon carbide semiconductor substrate, the second semiconductor layer having the first surface, and a second surface opposite to the first surface and facing the front surface of the silicon carbide semiconductor substrate.

According to another embodiment of the invention, a method of manufacturing a silicon carbide semiconductor device includes forming on a front surface of a silicon carbide semiconductor substrate of a first conductivity type, a first semiconductor layer of the first conductivity type, the first semiconductor layer containing silicon carbide and having an impurity concentration lower than an impurity concentration of the silicon carbide semiconductor substrate; selectively forming a first base region of a second conductivity type in the first semiconductor layer; forming on a first surface of first semiconductor layer opposite to a second surface thereof facing toward the front surface of the silicon carbide semiconductor substrate, a second semiconductor layer of the second conductivity type and containing silicon carbide; selectively forming in a surface region of the second semiconductor layer, a first semiconductor region of the first conductivity type; selectively forming in a surface layer of the second semiconductor layer, a second semiconductor region of the second conductivity type in contact with the first semiconductor region; forming a first electrode in contact with the first semiconductor region and the second semiconductor region; and forming a second electrode on a back surface of the silicon carbide semiconductor substrate. Forming the first base region includes forming the first base region at a position overlapping the second semiconductor region in a depth direction. Forming the first base region and forming the second semiconductor region include forming the first base region and the second semiconductor region so that a distribution of point defects in the depth direction from a first surface of the second semiconductor region, the first surface of the second semiconductor region being opposite to a second surface of the second semiconductor region facing the front surface of the silicon carbide semiconductor substrate, has two peaks at positions deeper than an interface between the first semiconductor layer and the first base region, a first peak of the two peaks being at a position deeper than a shallower second peak of the two peaks, and having a greater quantity of the point defects than does the second peak.

In the embodiment, forming the first base region includes forming the first base region by ion implantation, and forming the second semiconductor region includes forming the second semiconductor region by ion implantation.

In the embodiment, an acceleration energy of the ion implantation forming the first base region is greater than an acceleration energy of the ion implantation forming the second semiconductor region.

In the embodiment, forming the first base region includes implanting bivalent or trivalent ions.

In the embodiment, forming the second semiconductor layer includes forming the second semiconductor layer by epitaxial growth.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
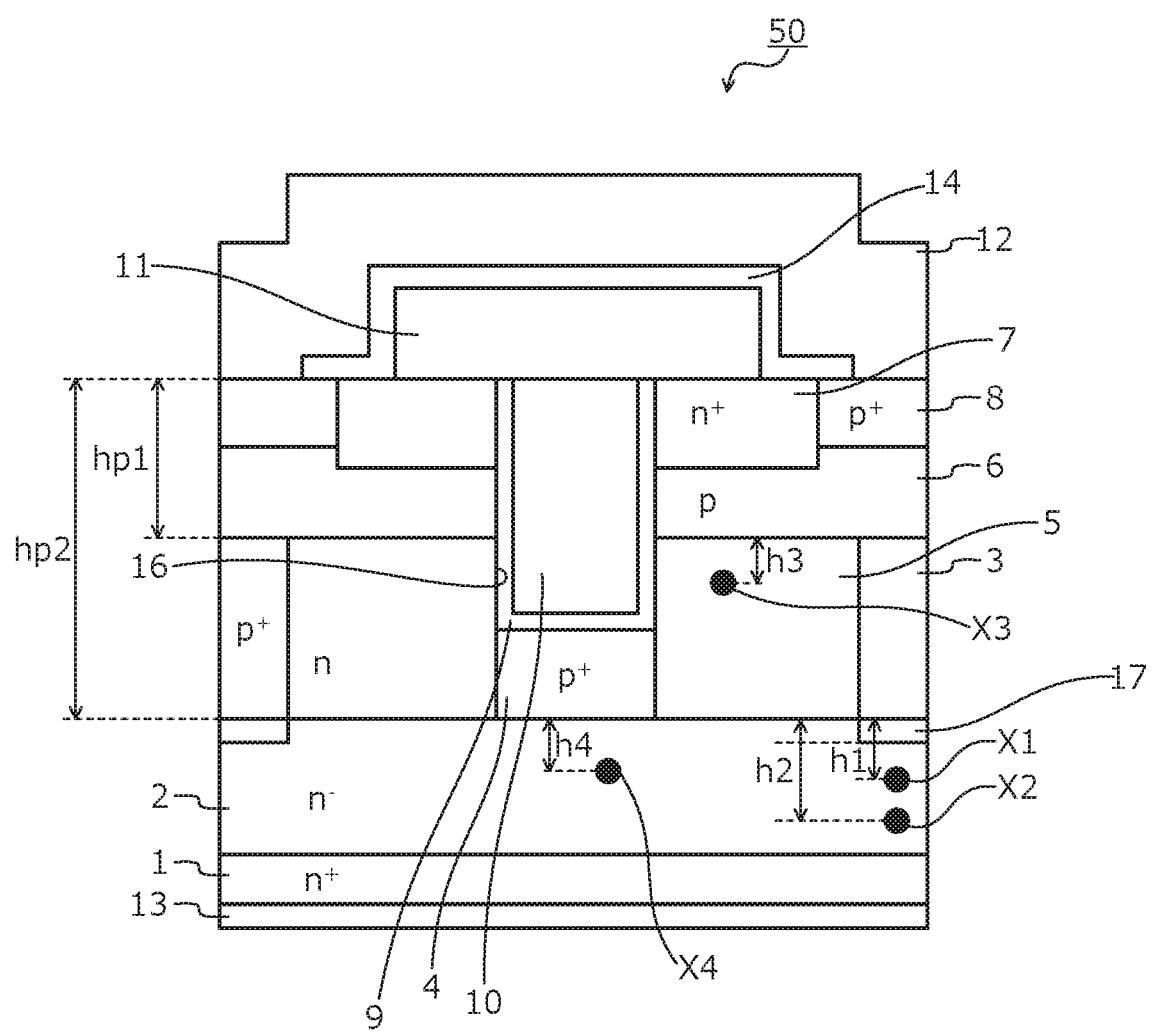
FIG. 1 is a cross-sectional view schematically depicting a structure of a silicon carbide semiconductor device according to an embodiment.

First, problems associated with the conventional techniques will be discussed. Here, when a trench structure is formed in a vertical MOSFET, to form a channel in a vertical direction, the structure is such that the entire region of the inner wall of the trench is covered by the gate insulating film 109 and since a portion of the gate insulating film 109 at a bottom of the trench 116 is near the back electrode 113, high electric field is easily applied to the portion of the gate insulating film 109 at the bottom of the trench 116. In particular, since ultra-high voltage elements are fabricated with a wide bandgap semiconductor material (semiconductor material having a bandgap wider than that of silicon, for example, silicon carbide (SiC)), adverse effects to the gate insulating film 109 at the bottom of the trench 116 greatly reduce reliability.

A p-type region in contact with the p-type base layer 106 and reaching a position deeper than is the bottom of the trench 116 and a p-type region at the bottom of the trench 116 are formed, whereby the strength of electric field at the bottom of the trench 116 is mitigated, enabling the problem of greatly reduced reliability to be resolved.

Nonetheless, in a structure in which the positions of point defects are made shallower than the PN junction interface as described above, peak positions of the quantity of the point defects are provided in the p-type base layer 106 and therefore, the p-type regions cannot be formed. Therefore, high electric field is applied to the gate insulating film 109 at the bottom of the trench 116, whereby the breakdown voltage of the silicon carbide semiconductor device that can configured is up to about 650V.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or – appended to n or p means that the impurity concentration is higher or lower, respectively, than layers and regions without + or –. In the description of the embodiments below and the accompanying drawings, main portions that are identical will be given the same reference numerals and will not be repeatedly described. Further, in the present description, when Miller indices are described, "–" means a bar added to an index immediately after the "–", and a negative index is expressed by prefixing "–" to the index. With consideration of variation in manufacturing, description indicating the same or equal may be within 5%.

A semiconductor device according to the invention is configured using a wide bandgap semiconductor material. In an embodiment, a silicon carbide semiconductor device fabricated using, for example, silicon carbide (SiC) as the wide bandgap semiconductor material will be described taking a MOSFET as an example. FIG. 1 is a cross-sectional view schematically depicting a structure of a silicon carbide semiconductor device according to the embodiment. FIG. 1 depicts an example of a trench-type MOSFET 50.

As depicted in FIG. 1, in the silicon carbide semiconductor device according to the embodiment, an $n^-$-type silicon carbide epitaxial layer (first semiconductor layer of a first conductivity type) 2 is deposited on a first main surface (front surface), for example, a (0001) plane (Si-face), of an $n^+$-type silicon carbide substrate (silicon carbide semiconductor substrate of the first conductivity type) 1.

The $n^+$-type silicon carbide substrate 1 is a silicon carbide single crystal substrate. The $n^-$-type silicon carbide epitaxial layer 2 has an impurity concentration that is lower than an impurity concentration of the $n^+$-type silicon carbide substrate 1 and, for example, is a low-concentration n-type drift layer. On a first surface of the $n^-$-type silicon carbide epitaxial layer 2, opposite to a second surface thereof facing toward the $n^+$-type silicon carbide substrate 1, an n-type high-concentration region (first semiconductor layer of the first conductivity type) 5 may be provided. The n-type high-concentration region 5 is a high-concentration n-type drift region having an impurity concentration that is lower than the impurity concentration of the $n^+$-type silicon carbide substrate 1 and higher than the impurity concentration of the $n^-$-type silicon carbide epitaxial layer 2.

On a first surface side of the $n^-$-type silicon carbide epitaxial layer 2, opposite to a second surface side thereof facing toward the $n^+$-type silicon carbide substrate 1, a p-type base layer (second semiconductor layer of a second conductivity type) 6 is provided. Hereinafter, the $n^+$-type silicon carbide substrate 1, the n⁻-type silicon carbide epitaxial layer 2, the n-type high-concentration region 5, and the p-type base layer 6 collectively are regarded as a silicon carbide semiconductor base.

On a second main surface (back surface, i.e., back surface of the silicon carbide semiconductor base) of the n⁺-type silicon carbide substrate 1, a drain electrode forming a back electrode (second electrode) 13 is provided. On a surface of the back electrode 13, a drain electrode pad (not depicted) is provided.

On a first main surface side of the silicon carbide semiconductor base (side having the p-type base layer 6), a trench structure is formed. In particular, when trenches 16 penetrate through the p-type base layer 6 from a first side (the first main surface side of the silicon carbide semiconductor base) of the p-type base layer 6, opposite to a second side thereof facing toward the n⁺-type silicon carbide substrate 1 and the n-type high-concentration region 5 (the n-type high-concentration region 5 is not provided, the trenches 16 reach the n⁻-type silicon carbide epitaxial layer 2, hereinafter simply "(2)"). Along an inner wall of each of the trenches 16, a gate insulating film 9 is formed on a bottom and side walls of each of the trenches 16. Gate electrodes 10 are formed on the gate insulating film 9 in the trenches 16. The gate electrodes 10 are insulated from the n⁻-type silicon carbide epitaxial layer 2 and the p-type base layer 6 by the gate insulating film 9. A portion of each of the gate electrodes 10 may protrude from tops (side where a source electrode (first electrode) 12 described hereinafter is provided) of the trenches 16 toward the source electrode 12.

In a surface layer of the n-type high-concentration region 5 (2), on a first side (the first main surface side of the silicon carbide semiconductor base) of the n-type high-concentration region 5 (2) opposite to a second side thereof facing toward the n⁺-type silicon carbide substrate 1, first p⁺-type base regions 3 are provided. Further, in the n-type high-concentration region 5 (2), second p⁺-type base regions 4 are provided in contact with the bottoms of the trenches 16. The second p⁺-type base regions 4 are formed at positions opposing the bottoms of the trenches 16 in a depth direction. A width of the second p⁺-type base regions 4 is equal to or wider than a width of the trenches 16. The bottoms of the trenches 16 may reach the second p⁺-type base regions 4 or may be positioned in the n-type high-concentration region 5 (2) between the p-type base layer 6 and the second p⁺-type base regions 4.

By providing the first p⁺-type base regions 3 and the second p⁺-type base regions 4, pn junctions between the first p⁺-type base regions 3, the second p⁺-type base regions 4, and the n-type high-concentration region 5 (2) may be formed at positions near the bottoms of the trenches 16 in the depth direction (direction from the source electrode 12 toward the back electrode 13). By forming the pn junctions between the first p⁺-type base regions 3, the second p⁺-type base regions 4, and the n-type high-concentration region 5 (2) in this manner, an application of high electric field to the gate insulating film 9 at the bottoms of the trenches 16 may be prevented. Therefore, high breakdown voltages become possible even when a wide bandgap semiconductor material is used as semiconductor material.

In the embodiment, in the n⁻-type silicon carbide epitaxial layer 2, n⁺-type regions 17 having peak impurity concentrations higher than the n-type high-concentration region 5 (2) are provided at positions deeper than the first p⁺-type base regions 3 between the trenches 1. The peak impurity concentrations of the n⁺-type regions 17 suffice to be higher than the impurity concentration of the n-type high-concentration region 5 (2) and the impurity concentration throughout each of the n⁺-type regions 17 needs not be higher than that of the n-type high-concentration region 5 (2). Further, in an instance where the n-type high-concentration region 5 is not provided, the peak impurity concentrations of the n⁺-type regions 17 are higher than the impurity concentration of the n⁻-type silicon carbide epitaxial layer 2.

Due to the n⁺-type regions 17, a part that determines the element breakdown voltage may be set to be the first p⁺-type base regions 3 between the trenches 16 rather than the second p⁺-type base regions 4 at the bottoms of the trenches 16. In other words, the breakdown voltage of the second p⁺-type base regions 4 at the bottoms of the trenches 16 may be made higher than the breakdown voltage of the first p⁺-type base regions 3 between the trenches 16.

Further, the n⁺-type regions 17 may be provided partially beneath (direction from the source electrode 12 toward the back electrode 13) the first p⁺-type base regions 3. In this case, it becomes possible to control a position where electric field concentrates. Furthermore, similar effects may be obtained with a smaller dose amount of nitrogen as compared to providing the n⁺-type regions 17 beneath the first p⁺-type base regions 3 overall and since the dose amount is smaller, ion implantation stages may be reduced.

In the p-type base layer 6, an n⁺-type source region (first semiconductor region of the first conductivity type) 7 and a p⁺-type contact region (second semiconductor region of the second conductivity type) 8 are selectively provided in the first main surface side of the silicon carbide semiconductor base. Further, the n⁺-type source regions 7 and the p⁺-type contact regions 8 are in contact with each other.

An interlayer insulating film 11 is provided on the first main surface side of the silicon carbide semiconductor base overall so as to cover the gate electrodes 10 embedded in the trenches 16. The source electrode 12 is in contact with the n⁺-type source regions 7 and the p⁺-type contact regions 8 via contact holes opened in the interlayer insulating film 11. The source electrode 12 is electrically insulated from the gate electrodes 10 by the interlayer insulating film 11. On the source electrode 12, a source electrode pad (not depicted) is provided. Between the source electrode 12 and the interlayer insulating film 11, for example, a barrier metal 14 that prevents diffusion of metal atoms from the source electrode 12 toward the gate electrodes 10 may be provided.

In FIG. 1, while only one cell (structure formed by one of the trenches 16, the gate insulating film 9, one of the gate electrodes 10, the interlayer insulating film 11, and the source electrode 12) is depicted, MOS gate (insulated gate formed by a metal, an oxide film, and a semiconductor material) structures of more cells may be further disposed in parallel.

In the silicon carbide semiconductor device of the embodiment, a distribution of point defects in the depth direction (A direction in FIG. 1) from a first surface of the p⁺-type contact regions 8, opposite to a second surface thereof facing toward the front surface of the n⁺-type silicon carbide substrate 1 is as follows. There are two peaks of point defects at positions deeper than pn interfaces (hereinafter, first pn interfaces and when the n⁺-type regions 17 are not provided, pn interfaces between the first p⁺-type base regions 3 and the n⁻-type silicon carbide epitaxial layer 2) between the first p⁺-type base regions 3 and the n⁺-type regions 17. For example, peaks of point defects are provided at positions of points X1, X2 in FIG. 1. Here, the peak positioned at the point X2 is deeper toward the n⁺-type silicon carbide substrate 1 than is the peak positioned at the point X1. Further, the peak positioned at the point X2 has a greater quantity of point defects than the peak positioned at the point X1.

The peak positioned at the point X1 is formed by ion implantation for forming the $p^+$-type contact regions 8 and the peak positioned at the point X2 is formed by ion implantation for forming the first $p^+$-type base regions 3. For example, the $p^+$-type contact regions 8 are formed by implantation of phosphorus (P) ions and the first $p^+$-type base regions 3 are formed by implantation of aluminum (Al) ions. The first $p^+$-type base regions 3 are thicker than the $p^+$-type contact regions 8 and therefore, ion are implanted by a large acceleration energy. Further, the impurity concentration of the first $p^+$-type base regions 3 is higher than the impurity concentration of the $p^+$-type contact regions 8. In this manner, the peak positioned at the point X2 has a greater quantity of point defects than the peak positioned at the point X1 due to the large number of ions implanted by ion implantation when the first $p^+$-type base regions 3 are formed, the large atomic number of the ion species, and the large acceleration energy.

Further, the position of the point X1 is separated from the first pn interfaces by a depth h1. The depth h1, for example, may be at least equal to a thickness hp1 of the p-type base layer 6 and in particular, may be at least 1.0 µm. Further, the depth h1, for example, may be at most a distance hp2 between a first surface of the p-type base layer 6, opposite to a second surface thereof facing toward the front surface of the $n^+$-type silicon carbide substrate 1 and a first surface of the first $p^+$-type base regions 3 facing toward the front surface side of the $n^+$-type silicon carbide substrate 1 and in particular, may be at most 2.3 µm, i.e., 1.0≤hp1≤h1≤hp2≤2.3 µm. FIG. 1 schematically depicts the structure and therefore, the relationship above is not accurately represented.

Further, the position of the point X2 is separated from the first pn interfaces by a depth h2. The depth h2 may be about two times the depth h1. In other words, the point X2 may be separated from the point X1 by the depth h1 (h2−h1=h1).

In this manner, in the embodiment, the points X1 and X2 that are positions of peaks of point defects are further than the first pn interfaces that are locations where electric field concentrates. As a result, drain leak current may be reduced. Further, in the embodiment, the points X1 and X2 that are positions of peaks of point defects are set in the $n^-$-type silicon carbide epitaxial layer 2. As a result, the first $p^+$-type base regions 3 and the second $p^+$-type base regions 4 may be formed in the n-type high-concentration region 5 (2). Therefore, the strength of the electric field applied to the gate insulating film 9 at the bottoms of the trenches 16 may be mitigated, thereby enabling a high-voltage silicon carbide semiconductor device of, for example, 1200V or greater to be realized.

Further, in the silicon carbide semiconductor device of the embodiment, the distribution of point defects in the depth direction (B direction and C direction in FIG. 1) from a region in which the $p^+$-type contact regions 8 are not provided is as follows. In the depth direction (B direction in FIG. 1) from an n-type region, for example, a region in which the $n^+$-type source region 7 is provided, there is one peak of point defects at a position deeper than a pn interface (hereinafter, second pn interface and when the n-type high-concentration region 5 is not provided, a pn interface between the p-type base layer 6 and the $n^-$-type silicon carbide epitaxial layer 2) between the p-type base layer 6 and the n-type high-concentration region 5. For example, there is a peak of point defects at a position of a point X3 in FIG. 1. Further, in the depth direction (C direction in FIG. 1) from the bottoms of the trenches 16, there is one peak of point defects at a position deeper than a pn interface (hereinafter, third pn interface) between the second $p^+$-type base regions 4 and the $n^-$-type silicon carbide epitaxial layer 2. For example, there is a peak of point defects a position of a point X4 in FIG. 1.

The peak at the position of the point X3 is formed by ion implantation for forming the $n^+$-type source regions 7 and the peak at the position of the point X4 is formed by ion implantation for forming the second $p^+$-type base regions 4. The $n^+$-type source regions 7 and the second $p^+$-type base regions 4 are thinner than the first $p^+$-type base regions 3 and therefore, the peak at the position of the point X3 and the peak at the position of the point X4 having a low dose amount in the ion implantation have fewer point defects than the peak positioned at the point X2.

The position of the point X3 is provided at a position at a depth h3 from the second pn interface and the position of the point X4 is provided at a position at a depth h4 from the third pn interface. The $n^+$-type source regions 7 and the second $p^+$-type base regions 4 are thinner than the first $p^+$-type base regions 3 and have a small acceleration energy for implanting ions and therefore, the depth h3 and the depth h4 are shallower than the depth h2 (h3<h2, h4<h2).

In this manner, in the embodiment, the quantities of point defects at the points X3 and X4 that are positions of the peaks of point defects are less than that of the peak at the position of the point X2. As a result, a path of drain leak current may be separated from the gate electrodes 10. Therefore, the strength of the electric field applied to the gate insulating film 9 at the bottoms of the trenches 16 may be mitigated, enabling reliability of the gate insulating film 9 to be increased.

Further, while FIG. 1 is an example of the trench-type MOSFET 50, in a planar type MOSFET, a junction field effect transistor (JFET) is present in a region in which the $p^+$-type contact regions 8 are not provided. In this case as well, in the depth direction from the JFET region, the distribution of point defects has one peak of point defects at a position that is deeper than a pn interface between the p-type base layer 6 and the $n^-$-type silicon carbide epitaxial layer 2.

Further, in a configuration in which a diode is built into the trench-type MOSFET 50 depicted in FIG. 1, a region of a built-in diode is present in a region in which the $p^+$-type contact regions 8 are not provided. For example, a Schottky barrier diode (SBD) trench is provided and by embedding a metal that forms a Schottky junction at the bottom of the trench, the diode may be built in. In this case, in the depth direction from the region of the built-in diode, the distribution of the point defects has one peak of point defects at a position deeper than a pn interface between the p-type base layer 6 and the $n^-$-type silicon carbide epitaxial layer 2.

Further, instead of a MOSFET, the present invention is applicable to a diode. In this case, the distribution of the point defects may be set to have one peak of point defects on an n region side from an interface between a p region and an n region of the diode. A SBD, a diode having a junction barrier Schottky (JBS) structure that is a combination of a pn junction and a Schottky junction, a merged PiN Schottky (MPS) diode that is a combination of a PiN (P-intrinsic-N diode) and a Schottky diode, etc. may be applied as the diode.

Figure 2:
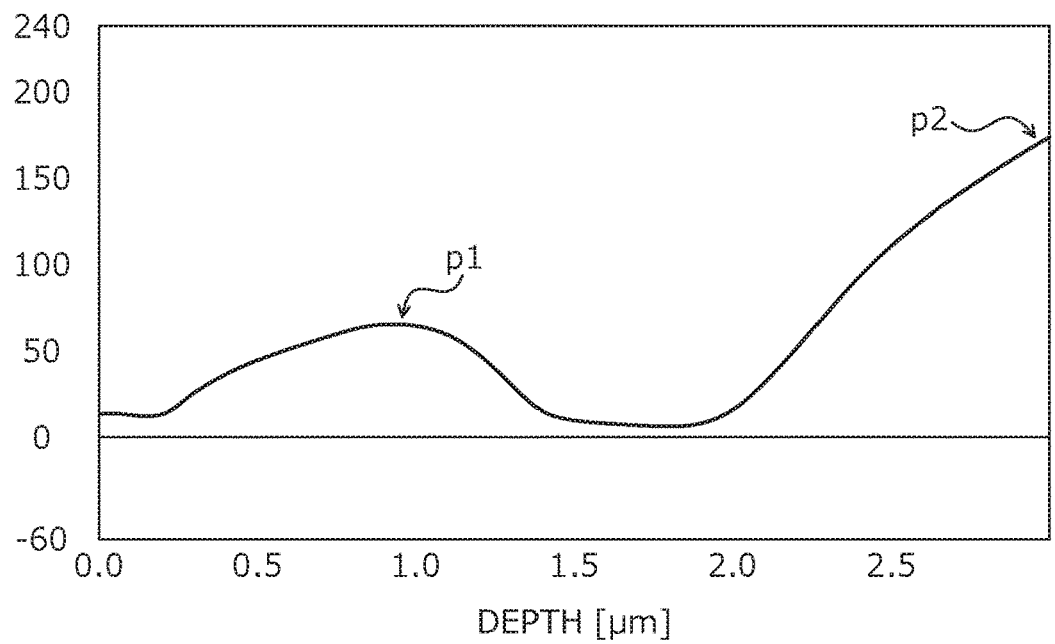
FIG. 2 is a graph depicting distribution of intensity of a CL spectrum beneath a $p^+$-type contact region of the silicon carbide semiconductor device according to the embodiment.

FIG. 2 is a graph depicting distribution of intensity of a CL spectrum beneath the $p^+$-type contact region of the silicon carbide semiconductor device according to the embodiment. In FIG. 2, a vertical axis indicates intensity of a CL (cathode luminescence) spectrum and a horizontal axis indicates depth from the first pn interfaces in units of μm. CL measurement represents the quantity, etc. of point defects by intensity in a specific spectrum and the greater is the intensity indicated in the specific spectrum for the point defects, the greater is the quantity of the point defects. As depicted in FIG. 2, two peaks p1, p2 are present, the peak p2 being larger of the two. The peak p1 corresponds to the peak positioned at the point X1 and the peak p2 corresponds to the peak positioned at the point X2. FIG. 2 depicts that in the depth direction from the first pn interfaces, there are two peaks of the quantity of the point defects and the deeper peak has many point defects.

Figure 3:
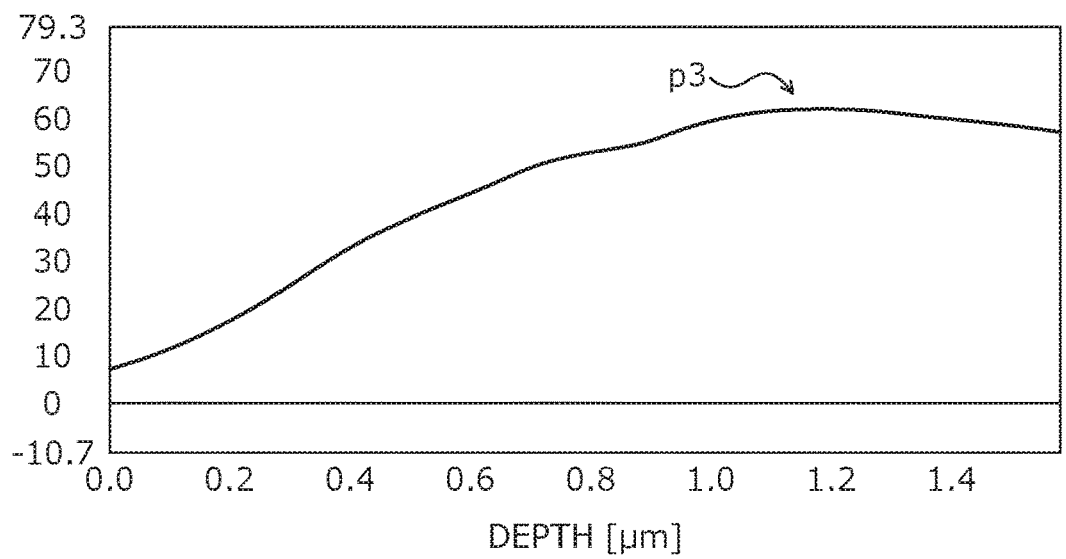
FIG. 3 is a graph depicting distribution of intensity of a CL spectrum beneath an $n^+$-type source region line B of the silicon carbide semiconductor device according to the embodiment.

Further, FIG. 3 is a graph depicting distribution of intensity of a CL spectrum beneath an $n^+$-type source region line B of the silicon carbide semiconductor device according to the embodiment. In FIG. 3, a vertical axis indicates intensity of the CL spectrum and a horizontal axis indicates depth from the second pn interface in units of μm. As depicted in FIG. 3, one peak p3 is present. The peak p3 corresponds to the peak at the position of the point X3 and FIG. 3 depicts that in the depth direction from the second pn interface, there is one peak of the quantity of point defects.

Further, while not depicted, a graph of distribution of the intensity of the CL spectrum along line C of the silicon carbide semiconductor device according to the embodiment is a graph that in the graph depicted in FIG. 2, has a shape in which a mountain-shape portion of the peak p1 has been cut out. Therefore, a graph depicting distribution of the intensity of the CL spectrum along line C indicates that in the depth direction from the third pn interface, there is one peak of the quantity of point defects.

A method of manufacturing the silicon carbide semiconductor device according to the embodiment will be described. FIGS. 4, 5, 6, 7, 8, and 9 are cross-sectional views of the silicon carbide semiconductor device according to the embodiment during manufacture.

Figure 4:
FIG. 4 is a cross-sectional view of the silicon carbide semiconductor device

First, the $n^+$-type silicon carbide substrate 1 containing silicon carbide of an n-type is prepared. Subsequently, on the first main surface of the $n^+$-type silicon carbide substrate 1, a first $n^-$-type silicon carbide epitaxial layer 2a containing silicon carbide is formed to a thickness of, for example, about 30 μm while an n-type impurity, for example, nitrogen atoms (N), is doped. The state up to here is depicted in FIG. 4.

Next, on the surface of the first $n^-$-type silicon carbide epitaxial layer 2a, a non-depicted mask having predetermined openings is formed by a photolithography technique, for example, using an oxide film. Subsequently, an n-type impurity, for example, nitrogen atoms may be ion implanted using the oxide film is used as a mask, whereby the $n^+$-type regions 17 are formed in the first $n^-$-type silicon carbide epitaxial layer 2a.

Next, the mask used during the ion implantation for forming the $n^+$-type regions 17 is removed. Next, on the surface of the first $n^-$-type silicon carbide epitaxial layer 2a, an ion implantation mask having predetermined openings is formed by a photolithography technique using, for example, an oxide film. Subsequently, a p-type impurity such as aluminum is implanted in the openings of the oxide film, forming lower first $p^+$-type base regions 3a of a depth of about 0.5 μm. In a case in which the $n^+$-type regions 17 are formed, on the surface of the $n^+$-type regions 17 on a first side thereof opposite to a second side thereof facing toward the $n^+$-type silicon carbide substrate 1, the lower first $p^+$-type base regions 3a are formed so as to overlap the $n^+$-type regions 17. The second $p^+$-type base regions 4 that form the bottoms of the trenches 16 may be formed concurrently with the lower first $p^+$-type base regions 3a. The lower first $p^+$-type base regions 3a and the second $p^+$-type base regions 4 that are adjacent to each other are forms so that a distance therebetween is about 1.5 μm. An impurity concentration of the lower first $p^+$-type base regions 3a and the second $p^+$-type base regions 4, for example, is set to be about $5\times10^{18}/cm^3$. Thus, peaks of point defects are formed at the position of the point X2 and at the position of the point X4.

Figure 5:
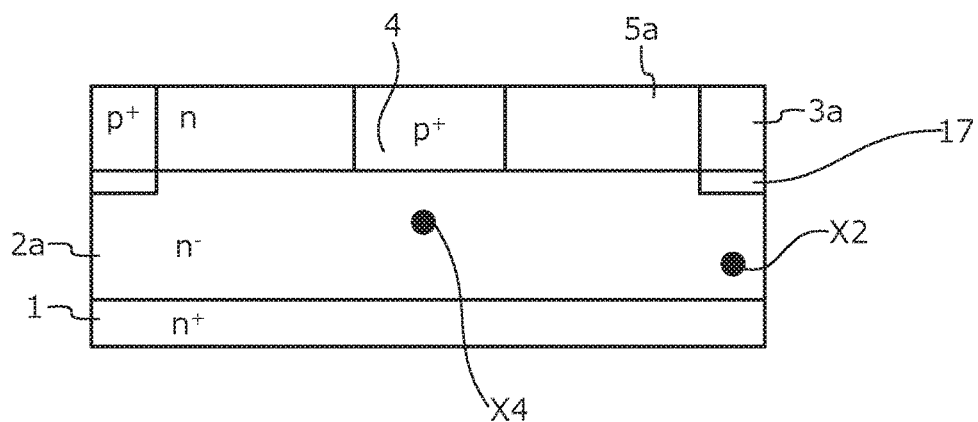
FIG. 5 is a cross-sectional view of the silicon carbide semiconductor device according to the embodiment during manufacture.

Next, for example, a lower n-type high-concentration region 5a of a depth of about 0.5 μm may be formed in portions of a surface region of the first $n^-$-type silicon carbide epitaxial layer 2a by removing portions of the ion implantation mask and ion implanting an n-type impurity such as nitrogen in the openings. An impurity concentration of the lower n-type high-concentration region 5a is set to, for example, about $1\times10^{17}/cm^3$. The state up to here is depicted in FIG. 5.

Next, on the surface of the first $n^-$-type silicon carbide epitaxial layer 2a, a second $n^-$-type silicon carbide epitaxial layer 2b having a thickness of about 0.5 μm is formed while an n-type impurity such as nitrogen is doped. An impurity concentration of the second $n^-$-type silicon carbide epitaxial layer 2b is set to be about $3\times10^{15}/cm^3$. Hereinafter, the first $n^-$-type silicon carbide epitaxial layer 2a and the second $n^-$-type silicon carbide epitaxial layer 2b collectively are the $n^-$-type silicon carbide epitaxial layer 2.

Next, on the surface of the second $n^-$-type silicon carbide epitaxial layer 2b, an ion implantation mask having predetermined openings is formed by photolithography using, for example, an oxide film. Subsequently, a p-type impurity such as aluminum is implanted in the openings of the oxide film and upper first $p^+$-type base regions 3b of a depth of about 0.5 μm are formed so as to overlap the lower first $p^+$-type base regions 3a. The lower first $p^+$-type base regions 3a and the upper first $p^+$-type base regions 3b form a continuous region, becoming the first $p^+$-type base regions 3. An impurity concentration of the upper first $p^+$-type base regions 3b is set to be, for example, about $5\times10^{18}/cm^3$.

Further, when the first $p^+$-type base regions 3a, the upper first $p^+$-type base regions 3b, and the second $p^+$-type base regions 4 are formed, bivalent or trivalent ions may be implanted. The bivalent or trivalent ions are, for example, $Al^{++}$, $Al^{+++}$, etc. because the acceleration energy for bivalent or trivalent ions is large and thus, point defects are easily generated.

Figure 6:
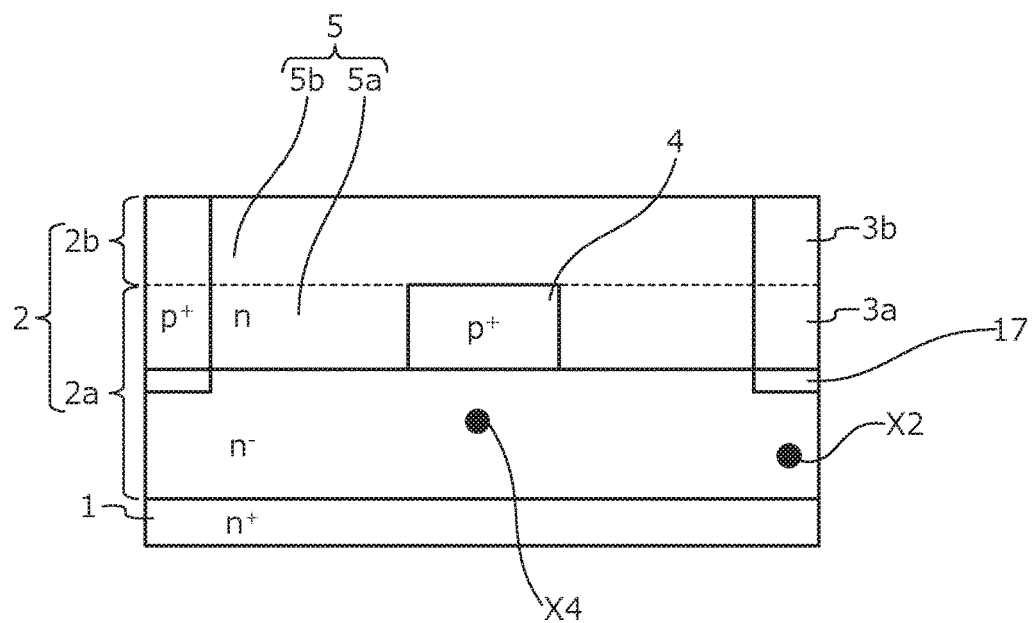
FIG. 6 is a cross-sectional view of the silicon carbide semiconductor device according to the embodiment during manufacture.

Next, for example, an upper n-type high-concentration region 5b of a depth of about 0.5 μm may be formed in a portion of a surface region of the second $n^-$-type silicon carbide epitaxial layer 2b by removing portions of the ion implantation mask and ion implanting an n-type impurity such as nitrogen in the openings. An impurity concentration of the upper n-type high-concentration region 5b, for example, is set to about $1\times10^{17}/cm^3$. The upper n-type high-concentration region 5b and the lower n-type high-concentration region 5a are formed so that at least portions thereof are in contact with each other, whereby the n-type high-concentration region 5 is formed. However, there are cases in which the n-type high-concentration region 5 is formed at the entire substrate surface and cases in which the n-type high-concentration region 5 is not formed. The state up to here is depicted in FIG. 6.

Next, on the surface of the $n^-$-type silicon carbide epitaxial layer 2, the p-type base layer 6 is formed by epitaxial growth to a thickness of about 1.1 μm. An impurity concentration of the p-type base layer 6 is set to about $4\times10^{17}/cm^3$. After the p-type base layer 6 is formed by epitaxial growth, the p-type base layer 6 may be further ion implanted with a p-type impurity such as aluminum.

Figure 7:
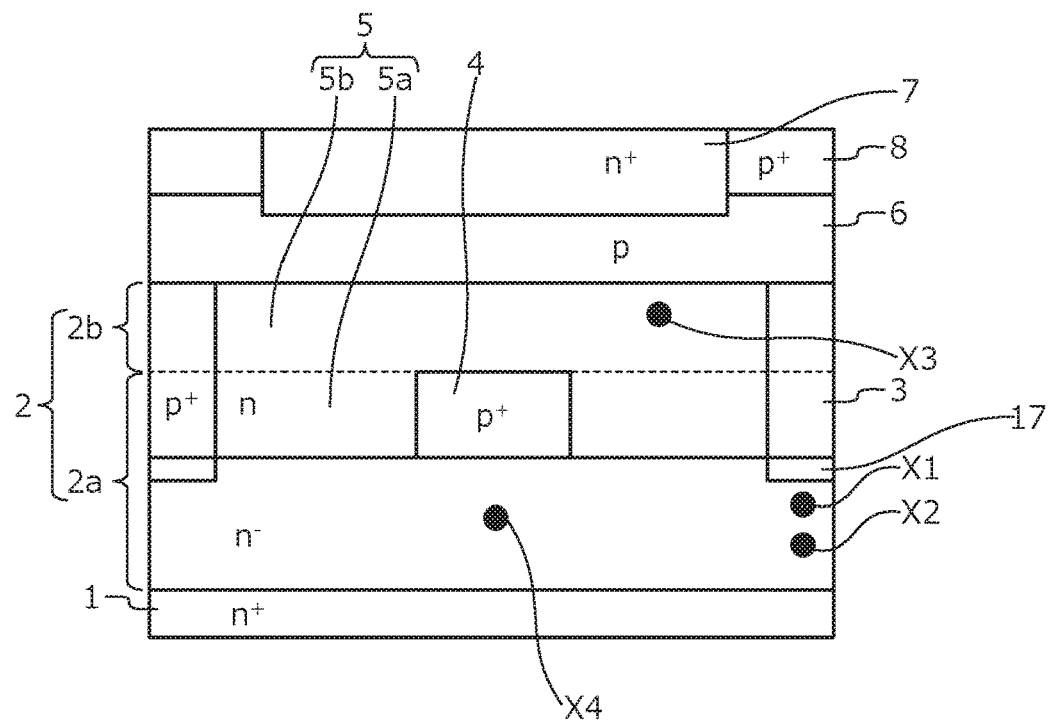
FIG. 7 is a cross-sectional view of the silicon carbide semiconductor device according to the embodiment during manufacture.

Next, on the surface of the p-type base layer 6, an ion implantation mask having predetermined openings is formed by photolithography using, for example, an oxide film. An n-type impurity such as nitrogen (N), phosphorus (P), etc. is ion implanted in the openings, whereby the $n^+$-type source regions 7 are formed at a portion of the surface of the p-type base layer 6. Thus, a peak of point defects is formed at the position of the point X3. Next, the ion implantation mask used in forming the $n^+$-type source regions 7 is removed, by a similar method, an ion implantation mask having predetermined openings is formed, a p-type impurity such as phosphorus is ion implanted at a portion of the surface of the p-type base layer 6, thereby forming the $p^+$-type contact regions 8. An impurity concentration of the $p^+$-type contact regions is set to be higher than the impurity concentration of the p-type base layer 6. Thus, the peak of point defects is formed at the position of the point X3. The state up to here is depicted in FIG. 7.

Further, when the ion implantations are performed, the acceleration energy of the ions when the $p^+$-type contact regions 8 are formed is set to be smaller than the acceleration energy of the ions when the lower first $p^+$-type base regions 3a and the upper first $p^+$-type base regions 3b are formed, or the dose amount is reduced. Thus, peaks of point defects are formed at the positions of the points X1 and X2 as depicted in FIG. 1 and the quantity of the point defects at the position of the point X1 is lower than the quantity of the point defects at the position of the point X2.

Further, an impurity when the lower first $p^+$-type base regions 3a and the upper first $p^+$-type base regions 3b are formed may be an impurity having an atomic number larger than that the impurity contained in the $n^-$-type silicon carbide epitaxial layer 2 and the $n^+$-type source regions 7 because when the atomic number is large, atomic mass is large, whereby point defects are easily generated.

Next, a heat treatment (annealing) in an inert gas atmosphere of 1700 degrees C. is performed, thereby implementing a process of activating the first $p^+$-type base regions 3, the second $p^+$-type base regions 4, the $n^+$-type source regions 7, the $p^+$-type contact regions 8, and the $n^+$-type regions 17. As described, ion implanted regions may be collectively activated by a single session of the heat treatment or activation may be implemented by performing the heat treatment each time ion implantation is performed.

Figure 8:
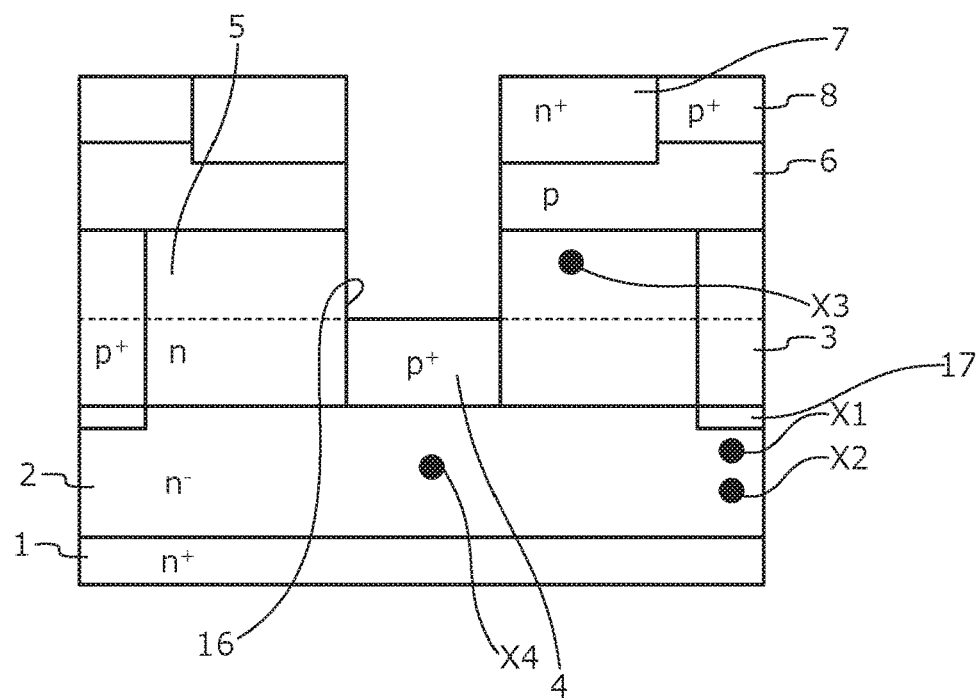
FIG. 8 is a cross-sectional view of the silicon carbide semiconductor device according to the embodiment during manufacture.

Next, on the surface of the p-type base layer 6, a trench formation mask having predetermined openings is formed by photolithography using, for example, an oxide film. Next, the trenches 16 that penetrate through the p-type base layer 6 and reach the n-type high-concentration region 5 (2) are formed by dry etching. The bottoms of the trenches 16 may reach the second $p^+$-type base regions 4 formed in the n-type high-concentration region 5 (2). Next, the trench formation mask is removed. The state up to here is depicted in FIG. 8.

Next, along the surface of the $n^+$-type source regions 7 and the bottoms and side walls of the trenches 16, the gate insulating film 9 is formed. The gate insulating film 9 may be formed by thermal oxidation of a temperature of about 1000 degrees C. in an oxygen atmosphere. Further, the gate insulating film 9 may be formed by a method of depositing by a chemical reaction such as that for a high temperature oxide (HTO).

Next, on the gate insulating film 9, a polycrystalline silicon layer doped with, for example, phosphorus atoms is provided. The polycrystalline silicon layer may be formed so as to be embedded in the trenches 16. The polycrystalline silicon layer is patterned by photolithography to be left in the trenches 16, thereby forming the gate electrodes 10.

Figure 9:
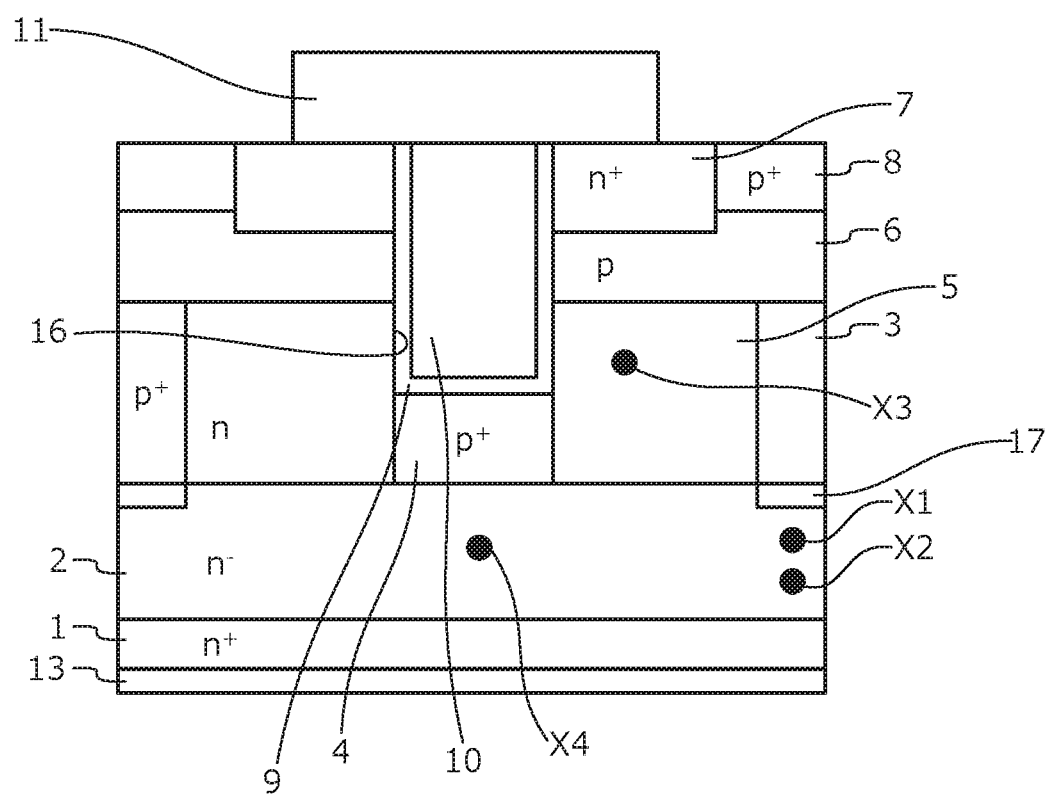
FIG. 9 is a cross-sectional view of the silicon carbide semiconductor device according to the embodiment during manufacture.
Figure 10:
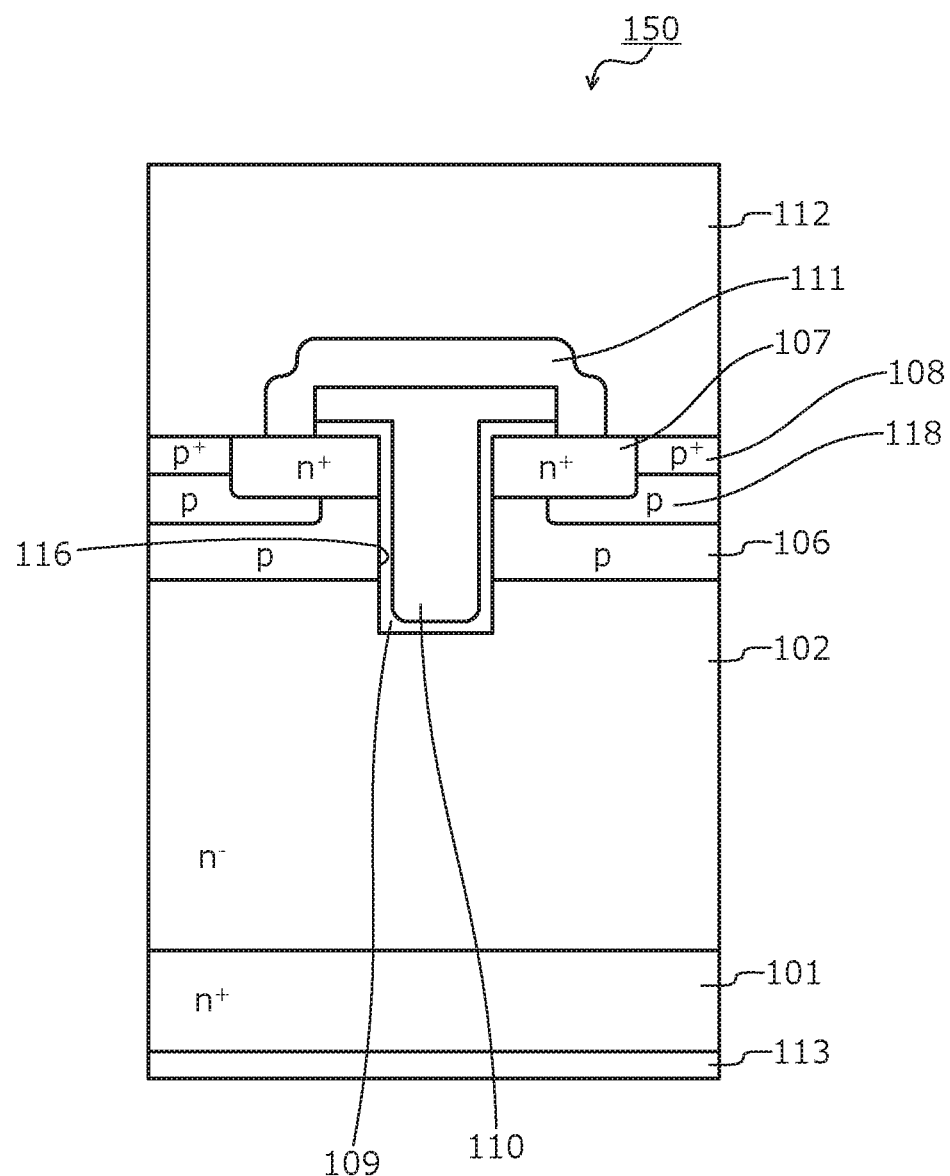
FIG. 10 is a cross-sectional view schematically depicting a structure of a conventional silicon carbide semiconductor device.

Next, for example, a phosphate glass is deposited to a thickness of about 1 µm so as to cover the gate insulating film 9 and the gate electrodes 10, thereby forming the interlayer insulating film 11. Next, the barrier metal 14 containing titanium (Ti) or titanium nitride (TiN) may be formed so as to cover the interlayer insulating film 11. The interlayer insulating film 11 and the gate insulating film 9 are patterned by photolithography, thereby forming contact holes that expose the $n^+$-type source regions 7 and the $p^+$-type contact regions 8. Thereafter, a heat treatment (reflow) is performed and the interlayer insulating film 11 is planarized. The state up to here is depicted in FIG. 9.

The interlayer insulating film 11 is selectively removed and on the surface of the silicon carbide semiconductor base, a nickel (Ni) or Ti film is formed. Next, the surface is protected and on a back surface side of the $n^+$-type silicon carbide substrate 1, a Ni or Ti film is formed. Next, a heat treatment of about 1000 degrees C. is performed, thereby forming ohmic electrodes on the front surface side of the silicon carbide semiconductor base and on the back surface side of the $n^+$-type silicon carbide substrate 1.

Next, a conductive film forming the source electrode 12 is provided on the interlayer insulating film 11 so as to be in contact with an ohmic electrode portion formed in the contact holes. The conductive film is selectively removed and is left only in the contact holes as the source electrode 12, so that the source electrode 12 is in contact with the $n^+$-type source regions 7 and the $p^+$-type contact regions 8. Next, the source electrode 12 other than in the contact holes is selectively removed.

Subsequently, on the second main surface of the $n^+$-type silicon carbide substrate 1, the back electrode 13 is formed by, for example, a nickel (Ni) film. Thereafter, for example, a heat treatment is performed at a temperature of about 970 degrees C., thereby forming an ohmic junction between the $n^+$-type silicon carbide substrate 1 and the back electrode 13.

Next, for example, by a sputtering technique, on the source electrode 12 on the front surface of the silicon carbide semiconductor base and in the openings of the interlayer insulating film 11, an electrode pad forming the source electrode pad (not depicted) is deposited. A thickness of a portion of the electrode pad on the interlayer insulating film 11 may be, for example, 5 µm. The electrode pad, for example, may be formed by aluminum (Al—Si) containing silicon at a rate of 1%. Next, the source electrode pad is selectively removed.

Next, on the surface of the back electrode 13, for example, titanium (Ti), nickel (Ni), and gold (Au) are sequentially deposited as the drain electrode pad (not depicted). Thus, the semiconductor device depicted in FIG. 1 is completed.

As described above, according to the silicon carbide semiconductor device according to the embodiment, the positions of peaks of point defects may be further than the first pn interfaces that are locations where electric field concentrates. As a result, the drain leak current may be reduced. Further, in the embodiment, the positions of the peaks of point defects are set in the $n^-$-type silicon carbide epitaxial layer. As a result, the first $p^+$-type base region 3 and the second $p^+$-type base region 4 may be formed in the p-type base layer. Therefore, the strength of the electric field applied to the gate insulating film at the bottoms of the trenches may be mitigated, thereby enabling a high-voltage silicon carbide semiconductor device of, for example, 1200V or greater to be realized.

In the foregoing, various modifications within a range not departing from the spirit of the invention are possible. For example, in the embodiments, dimensions, impurity concentrations, etc. of parts are variously set according to required specifications. Further, in the described embodiments, while an example of a case in which silicon carbide is used as the wide bandgap semiconductor material is described, other than silicon carbide, for example, gallium nitride (GaN) is applicable as the wide bandgap semiconductor material. Further, in the embodiments, while the first conductivity type is an n-type and the second conductivity type is a p-type, the invention is similarly implemented when the first conductivity type is a p-type and the second conductivity type is an n-type.

According to the invention described above, the position of a peak of point defects further than the interface that is between the first semiconductor layer of the first conductivity type and the second semiconductor layer of the second conductivity type and that is a location where electric field concentrates. As a result, the drain leak current may be reduced. Further, in the embodiment, the position of a peak of point defects is set in the n$^-$-type silicon carbide epitaxial layer (first semiconductor layer of the first conductivity type). As a result, the first p$^+$-type base region (first base region of the second conductivity type) may be formed in the p-type base layer (second semiconductor layer of the second conductivity type). Therefore, the strength of the electric field applied to the gate insulating film at the bottoms of the trenches may be mitigated, thereby enabling a high-voltage silicon carbide semiconductor device of, for example, 1200V or greater to be realized.

The silicon carbide semiconductor device and the method of manufacturing a silicon carbide semiconductor device according to the invention achieve an effect in that drain leak current is reduced and high breakdown voltage of about 1200V or higher becomes possible.

As described above, the silicon carbide semiconductor device and the method of manufacturing a silicon carbide semiconductor device according to the invention are useful for a silicon carbide semiconductor device used in inverter circuits in which a diode is connected in antiparallel to the silicon carbide semiconductor device.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate of a first conductivity type, having a front surface and a back surface opposite to the front surface;
   a first semiconductor layer of the first conductivity type, provided on the front surface of the silicon carbide semiconductor substrate, and containing silicon carbide, the first semiconductor layer having an impurity concentration lower than an impurity concentration of the silicon carbide semiconductor substrate, and further having a first side, and a second side opposite to the first side and facing the front surface of the silicon carbide semiconductor substrate;
   a first base region of a second conductivity type, selectively provided in the first semiconductor layer, the first base having a first surface, and a second surface opposite to the first surface and facing the front surface of the silicon carbide semiconductor substrate;
   a second semiconductor layer of the second conductivity type, provided on the first side of the first semiconductor layer, and containing silicon carbide;
   a first semiconductor region of the first conductivity type, selectively provided in a surface layer of the second semiconductor layer;
   a second semiconductor region of the second conductivity type, selectively provided in the surface layer of the second semiconductor layer, and being in contact with the first semiconductor region, the second semiconductor region having a first surface, and a second surface opposite to the first surface and facing the front surface of the silicon carbide semiconductor substrate;
   a first electrode in contact with the first semiconductor region and the second semiconductor region; and
   a second electrode provided on the back surface of the silicon carbide semiconductor substrate, wherein
   the first base region is provided so as to overlap the second semiconductor region in a depth direction,
   in the second semiconductor region, a distribution of point defects in the depth direction from the first surface of the second semiconductor region has first and second peaks at positions deeper than a position of an interface between the first semiconductor layer and the second surface of the first base region, and
   the first peak has a deeper position than does the first peak and has a greater quantity of the point defects than does the second peak.

2. The silicon carbide semiconductor device according to claim 1, wherein
   the surface layer of the second semiconductor layer has a region that is free of the second semiconductor region,
   in the region free of the second semiconductor region, a distribution of point defects in the depth direction from a first surface of the region of the surface layer of the second semiconductor layer has one third peak at a position deeper than a position of an interface between the first semiconductor layer and the second semiconductor layer, the first surface of the region being opposite to a second surface of the region of the surface layer of the second semiconductor layer facing the front surface of the silicon carbide semiconductor substrate, and
   the third peak has a smaller quantity of the point defects than does the first peak.

3. The silicon carbide semiconductor device according to claim 2, wherein
   the region that is free of the second semiconductor region is of the first conductivity type.

4. The silicon carbide semiconductor device according to claim 2, wherein
   the region that is free of the second semiconductor region has a SBD structure, a JBS structure, a PiN structure, or a MPS structure.

5. The silicon carbide semiconductor device according to claim 2, wherein
   the region that is free of the second semiconductor region is a JFET region.

6. The silicon carbide semiconductor device according to claim 2, wherein
   the region that is free of the second semiconductor region is a part of the first semiconductor region.

7. The silicon carbide semiconductor device according to claim 2, further comprising:
   a trench that penetrates the second semiconductor layer and the first semiconductor region, and reaches the first semiconductor layer;

a second base region of the second conductivity type, selectively provided in the first semiconductor layer so as to contact a bottom of the trench;

a gate electrode provided in the trench via a gate insulating film; and an interlayer insulating film provided on the gate electrode, wherein the region that is free of the second semiconductor region is located between the bottom of the trench and the silicon carbide semiconductor substrate.

8. The silicon carbide semiconductor device according to claim 1, wherein the first base region contains aluminum as an impurity.

9. The silicon carbide semiconductor device according to claim 1, wherein the first semiconductor layer and the first semiconductor region contain nitrogen or phosphorus as an impurity.

10. The silicon carbide semiconductor device according to claim 1, wherein an impurity contained in the first base region has an atomic number larger than an atomic number of an impurity contained in the first semiconductor layer and the first semiconductor region.

11. The silicon carbide semiconductor device according to claim 1, wherein an impurity concentration of the first base region is higher than an impurity concentration of the second semiconductor region.

12. The silicon carbide semiconductor device according to claim 1, wherein a depth of the second peak from the interface between the first semiconductor layer and the second surface of the first base region is at least a thickness of the second semiconductor layer and at most a distance from a first surface of the second semiconductor layer to the second surface of the second base region facing toward the front surface of the silicon carbide semiconductor substrate, the second semiconductor layer having the first surface, and a second surface opposite to the first surface and facing the front surface of the silicon carbide semiconductor substrate.

13. A method of manufacturing a silicon carbide semiconductor device, the method comprising:

forming on a front surface of a silicon carbide semiconductor substrate of a first conductivity type, a first semiconductor layer of the first conductivity type, the first semiconductor layer containing silicon carbide and having an impurity concentration lower than an impurity concentration of the silicon carbide semiconductor substrate;

selectively forming a first base region of a second conductivity type in the first semiconductor layer;

forming on a first surface of first semiconductor layer opposite to a second surface thereof facing toward the front surface of the silicon carbide semiconductor substrate, a second semiconductor layer of the second conductivity type and containing silicon carbide;

selectively forming in a surface region of the second semiconductor layer, a first semiconductor region of the first conductivity type;

selectively forming in a surface layer of the second semiconductor layer, a second semiconductor region of the second conductivity type in contact with the first semiconductor region;

forming a first electrode in contact with the first semiconductor region and the second semiconductor region; and forming a second electrode on a back surface of the silicon carbide semiconductor substrate, wherein forming the first base region includes forming the first base region at a position overlapping the second semiconductor region in a depth direction, forming the first base region and forming the second semiconductor region include forming the first base region and the second semiconductor region so that a distribution of point defects in the depth direction from a first surface of the second semiconductor region, the first surface of the second semiconductor region being opposite to a second surface of the second semiconductor region facing the front surface of the silicon carbide semiconductor substrate, has two peaks at positions deeper than an interface between the first semiconductor layer and the first base region, a first peak of the two peaks being at a position deeper than a shallower second peak of the two peaks, and having a greater quantity of the point defects than does the second peak.

14. The method according to claim 13, wherein forming the first base region includes forming the first base region by ion implantation, and forming the second semiconductor region includes forming the second semiconductor region by ion implantation.

15. The method according to claim 14, wherein an acceleration energy of the ion implantation forming the first base region is greater than an acceleration energy of the ion implantation forming the second semiconductor region.

16. The method according to claim 14, wherein forming the first base region includes implanting bivalent or trivalent ions.

17. The method according to claim 13, wherein forming the second semiconductor layer includes forming the second semiconductor layer by epitaxial growth.

* * * * *